(12) United States Patent
Hasegawa

(10) Patent No.: US 7,559,773 B2
(45) Date of Patent: Jul. 14, 2009

(54) ELECTRICAL CONNECTING APPARATUS

(75) Inventor: Yoshiei Hasegawa, Kawasaki (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 0 days.

(21) Appl. No.: 12/246,950

(22) Filed: Oct. 7, 2008

(65) Prior Publication Data

US 2009/0117759 A1 May 7, 2009

(30) Foreign Application Priority Data

Nov. 2, 2007 (JP) .............................. 2007-285784

(51) Int. Cl.
*H01R 12/00* (2006.01)
(52) U.S. Cl. ...................................... 439/78
(58) Field of Classification Search .................. 439/78, 439/66, 862, 68–72, 824, 91, 74, 636, 638
See application file for complete search history.

(56) References Cited

U.S. PATENT DOCUMENTS 6,688,893 B1 * 2/2004 Huang et al. .................. 439/66
7,156,706 B2 * 1/2007 Brown et al. ................. 439/862
7,364,434 B2 * 4/2008 Hu et al. ....................... 439/66

FOREIGN PATENT DOCUMENTS

JP    2005201844    7/2005
JP    2005203606    7/2005

* cited by examiner

*Primary Examiner*—Edwin A. Leon
(74) *Attorney, Agent, or Firm*—Ingrassia Fisher & Lorenz, P.C.

(57) ABSTRACT

The present invention prevents damage of adjacent mounting portions caused by heat at the time of mounting of contactors and further reduces the arrangement pitch of the contactors. An electrical connecting apparatus uses at least four types of contactors different in terms of at least the shapes of seat portions and the height positions of arm portions. Each of such contactors has a seat portion mounted on a mounting portion of a board, an arm portion extending in the left-right direction from the lower end of the seat portion, and a probe tip portion extending downward from the tip end portion of the arm portion and having a probe tip at the lower end. These contactors are mounted in parallel in a cantilevered manner alternately in the front-back direction with the mounting positions to the board displaced in the left-right direction.

10 Claims, 13 Drawing Sheets

Fig. 10(A1) Fig. 10(A2)
Fig. 10(B1) Fig. 10(B2)
Fig. 10(C1) Fig. 10(C2)
Fig. 10(D1) Fig. 10(D2)
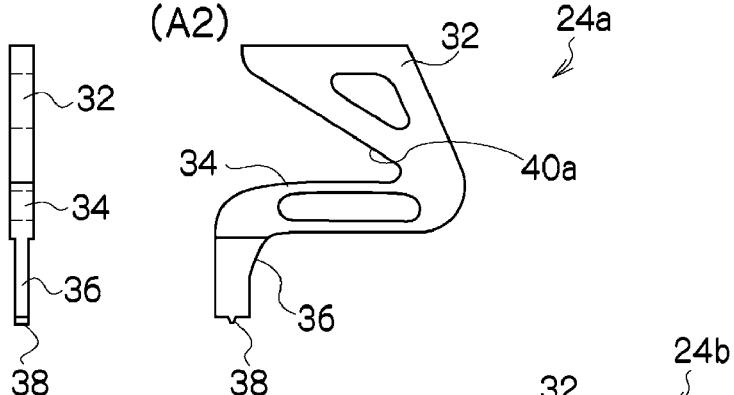
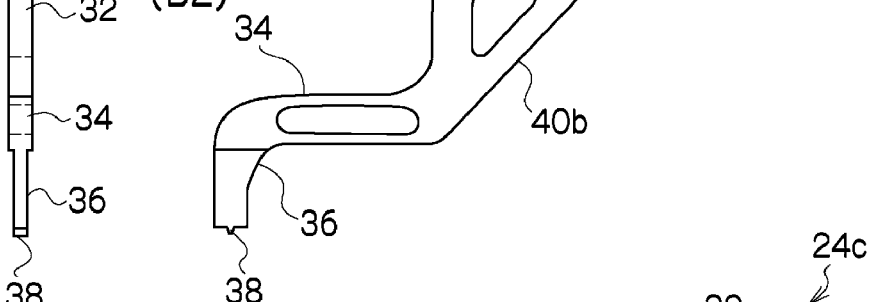
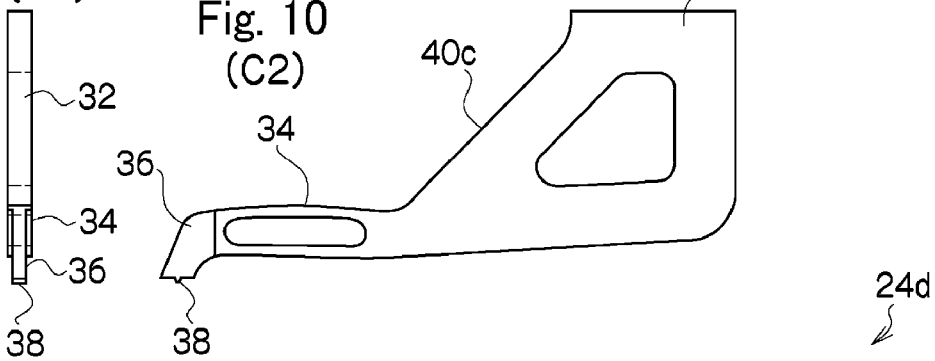
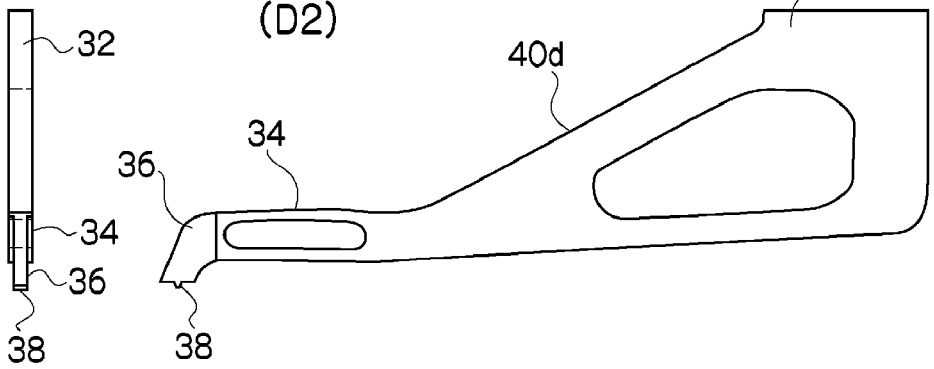

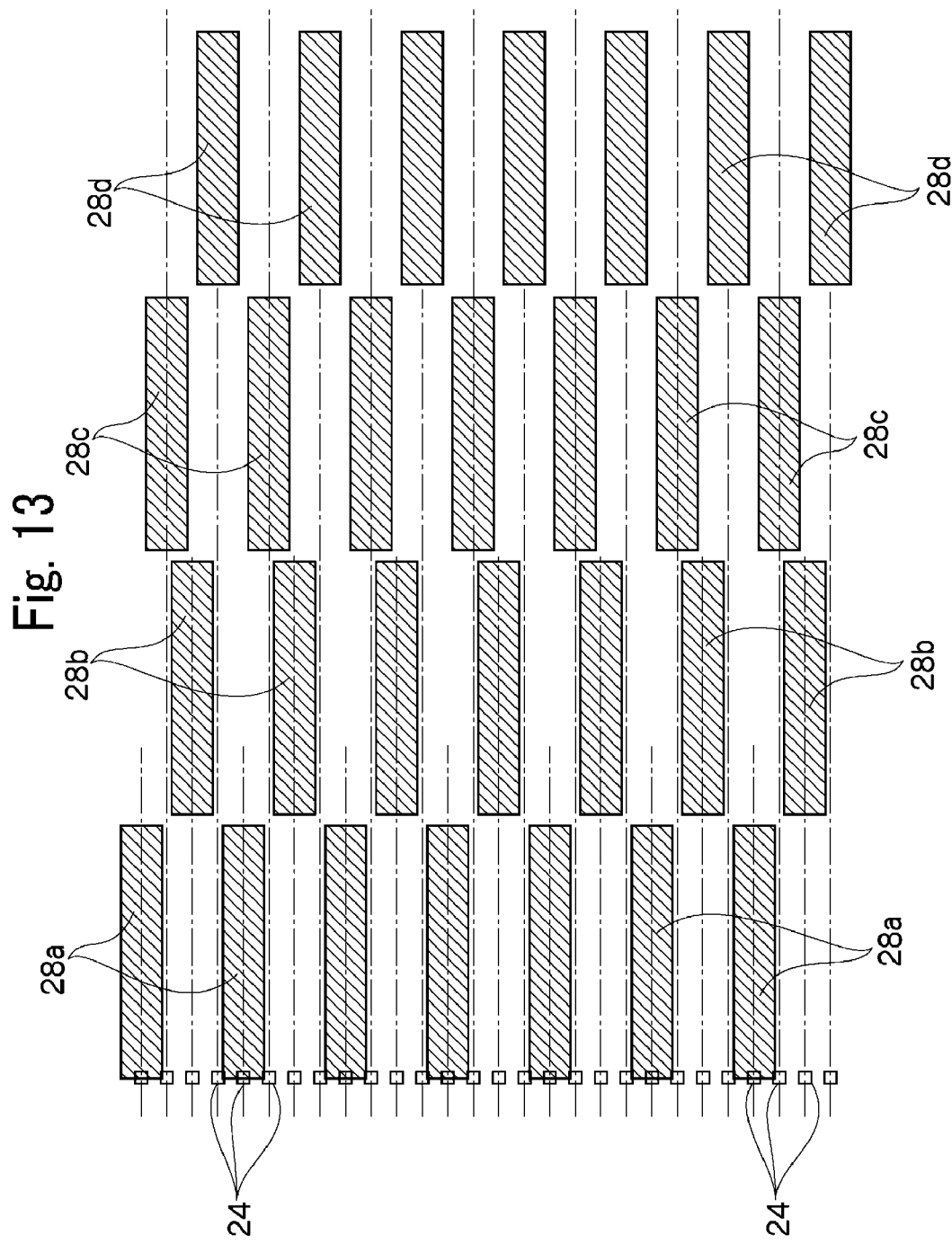

ELECTRICAL CONNECTING APPARATUS

TECHNICAL FIELD

The present invention relates to an electrical connecting apparatus for use in an electrical test of a flat-plate-shaped device under test such as a semiconductor integrated circuit.

BACKGROUND ART

A flat-plate-shaped device under test such as a semiconductor integrated circuit undergoes an electrical test to determine whether or not it is manufactured in accordance with the specification. The electrical test of this kind is performed by using an electrical connecting apparatus, such as a probe card, an IC socket, a probe block, a probe unit, or the like, having a plurality of probes or contactors to be thrust to respective electrodes of the device under test. The electrical connecting apparatus of this kind is used to electrically connect the electrodes of the device under test to a tester.

As one of the IC probe cards of this kind, there is one in which multiple plate-shaped probes or contactors are mounted on mounting portions of a base plate or board such as a wiring board, a probe board, etc. in a cantilevered manner to supply power to multiple non-cutting integrated circuits in a semiconductor wafer form simultaneously or in several batches, as described in Patent Documents 1 and 2.

[Patent Document 1]

Japanese Patent Appln. Public Disclosure No. 2005-203606

[Patent Document 2]

Japanese Patent Appln. Public Disclosure No. 2005-201844

Each of these conventional techniques comprises at least one contactor group in which a plurality of plate-shaped contactors are arranged in a line and attaches each contactor to a mounting portion such as a wire, a connection land, etc. of a board such as a wiring board, a probe board, etc. by conductive adhesive such as solder. Mounting the contactor to the mounting portion is performed per contactor since the arrangement pitch of the contactors is narrow, which makes it difficult to mount a plurality of contactors simultaneously.

Also, to prevent an adjacent contactor that has been mounted from being damaged at the time of mounting a contactor to a mounting portion and to prevent contactors adjacent to one another from electrically interfering with one another in a state where they are incorporated in an IC socket, the mounting positions to the mounting portions are displaced in a direction intersecting with the arrangement direction of the contactors, that is, are arranged in zigzags.

Meanwhile, in recent years, the number of integrated circuits to be integrated in one semiconductor wafer increases, and thus the arrangement pitch of the electrodes is further reduced. Such a trend tends to proceed further in the future.

However, in each of the conventional apparatuses, the contactors in one contactor group are just divided into two sub groups whose mounting positions differ in a direction intersecting with the arrangement direction of the contactors. Thus, when each of the conventional apparatuses is to be applied to an electrical test of an integrated circuit in which the electrodes are arranged in a fine pitch as described above, the adjacent contactors will contact, and indeed the electrical test cannot be performed.

BRIEF SUMMARY OF THE INVENTION

Technical Problem

It is an object of the present invention to prevent damage of adjacent mounting portions caused by heat at the time of mounting of contactors and further reduce the arrangement pitch of the contactors.

Solution to Problem

An electrical connecting apparatus according to the present invention comprises a board having first, second, third, and fourth mounting portion groups each including a plurality of mounting portions spaced from one another in a front-back direction and arranged on a lower surface of the board such that the mounting portions in each of the mounting portion group are displaced in a left-right direction from the mounting portions in the other of the mounting portion groups; and first, second, third, and fourth contactor groups each including a plurality of plate-shaped contactors in which the contactors in the first, second, third, and fourth contactor groups respectively correspond to the mounting portions in the first, second, third, and fourth mounting portion groups and are mounted to corresponding mounting portions in a cantilevered manner in a state of extending from said corresponding mounting portions in the same direction, and in which the mounting positions to said board are displaced in said left-right direction.

Each contactor has a seat portion mounted on the corresponding mounting portion at the upper end portion, an arm portion extending in the left-right direction from the lower end of the seat portion, and a probe tip portion extending downward from the tip end portion of the arm portion and having a probe tip at the lower end.

The contactors in the first, second, third, and fourth contactor groups are identical in terms of the height positions of the probe tips but are different from one another in terms of the shapes of the seat portions.

The height positions of the arm portions of the contactors in the first contactor group are different from the height positions of the arm portions of the contactors in at least the third and fourth contactor groups.

Each seat portion of each contactor in the first, second, third, and fourth contactor groups may have an inclined portion inclined in the left-right direction to one side or to the other side of the board.

Each seat portion of each contactor in the first contactor group may be inclined on one side in the left-right direction, and the inclined portion of each seat portion of each contactor in the second, third, and fourth contactor groups may be inclined on the other side in the left-right direction.

The seat portions of the contactors in the first, second, third, and fourth contactor groups may be mounted on the mounting portions in a state where the mounting positions to the board are gradually distanced in the left-right direction from the positions of the probe tips further in the order of the first, second, third, and fourth contactor groups.

The contactors in the first, second, third, and fourth contactor groups may be placed alternately in the front-back direction in the order of the contactors in the first, third, second, and fourth contactor groups or in the order of the contactors in the first, fourth, second, and third contactor groups.

The contactors adjacent to one another in the front-back direction may overlap one another at parts of the arm portions, seen from the upper side.

The probe tips of the contactors in the first, second, third, and fourth contactor groups may be aligned on a common virtual line extending in the front-back direction.

The board may further have the board further has fifth, sixth, seventh, and eighth mounting portion groups each including a plurality of mounting portions at positions distanced from the mounting portions in the first, second, third, and fourth mounting portion groups at the same side in the left-right direction further than the positions of the probe tips of said respective contactors in said first, second, third, and fourth contactor groups and arranged on the lower surface such that the mounting portions in each of the fifth, sixth, seventh, and eighth mounting portion groups are displaced in said front-back direction from one another, for each group, and that the mounting portions in the fifth, sixth, seventh, and eighth mounting portion groups are placed alternately in said front-back direction. In such a case. the electrical connecting apparatus may further comprise fifth, sixth, seventh, and eighth contactor groups each including plural plate-shaped contactors in which the contactors in the fifth, sixth, seventh, and eighth contactor groups respectively correspond to said mounting portions in the fifth, sixth, seventh, and eighth mounting portion groups and are mounted on corresponding mounting portions in a cantilevered manner in a state of extending from the corresponding mounting portions to a side of the contactors in the first, second, third, and fourth contactor groups, and in which the mounting positions are displaced to the board in the left-right direction.

Each of said contactors in the fifth, sixth, seventh, and eighth contactor groups may have a seat portion mounted on the corresponding mounting portion at the upper end portion, an arm portion extending in said left-right direction from the lower end of the seat portion, and a probe tip portion extending downward from the tip end portion of the arm portion and having a probe tip at the lower end.

The contactors in the fifth, sixth, seventh, and eighth contactor groups may be identical in terms of the height positions of the probe tips but may be different from one another in terms of the shapes of the seat portions. Also, the height positions of the arm portions of the contactors in the fifth contactor group may be different from the height positions of the arm portions of the contactors in at least the seventh and eighth contactor groups.

The probe tips of said contactors in said first, second, third, and fourth contactor groups may be aligned on a common virtual line, and the probe tips of said contactors in said fifth, sixth, seventh, and eighth contactor groups may be aligned on another common virtual line extending in said front-back direction distanced opposite a side of said contactors in said first, second, third, and fourth contactor groups from said virtual line on which said probe tips of said contactors in said first, second, third, and fourth contactor groups are aligned.

The probe tips of the contactors in the fifth, sixth, seventh, and eighth contactor groups may be aligned on a second common virtual line extending in the front-back direction distanced opposite a side of the contactors in the first, second, third, and fourth contactor groups from the virtual line on which the probe tips of the contactors in the first, second, third, and fourth contactor groups are aligned.

ADVANTAGEOUS EFFECTS OF INVENTION

As the mounting positions to the board of the contactors in the first, second, third, and fourth contactor groups are displaced in the left-right direction, the contactors in the first, second, third, and fourth contactor groups are identical in terms of the height positions of the probe tips but are different from one another in terms of the shapes of the seat portions, and the height positions of the arm portions of the contactors in the first contactor group are different from the height positions of the arm portions of the contactors in at least the third and fourth contactor groups, not only the center-to-center dimension in the left-right direction of the mounting positions to the board of the contactors in the first, second, third, and fourth contactor groups adjacent to one another in the front-back direction but also the center-to-center dimension in the front-back direction of the mounting positions to the board of the contactors in the respective contactor groups adjacent to one another in the front-back direction increase.

As a result of the above, even when the arrangement pitch of the contactors is reduced, it is prevented that heat at the time of mounting of the contactors to the board influences the contactors and the mounting portions adjacent in the front-back direction, which prevents the adjacent mounted contactors and the adjacent mounting portions from being damaged, and the arrangement pitch of the contactors can be further reduced.

BRIEF DESCRIPTION OF THE DRAWINGS

FIG. 10 explains shapes of various kinds of contactors.

FIG. 13 is a view similar to FIG. 9 showing another arrangement example shown in FIG. 12.

DETAILED DESCRIPTION OF THE INVENTION

Regarding Terms

Figure 1:
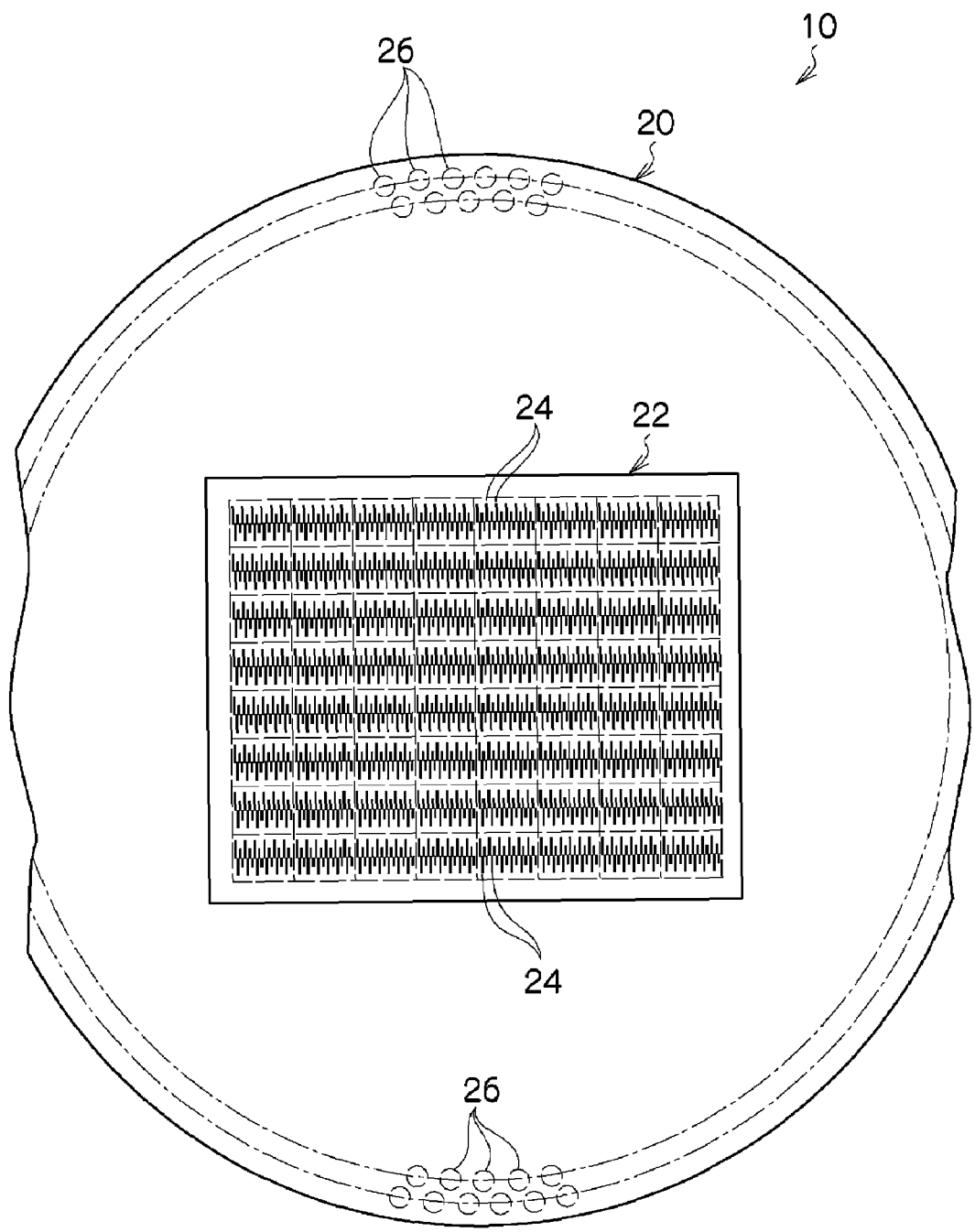
FIG. 1 is a bottom view showing one embodiment of an electrical connecting apparatus according to the present invention.
Figure 2:
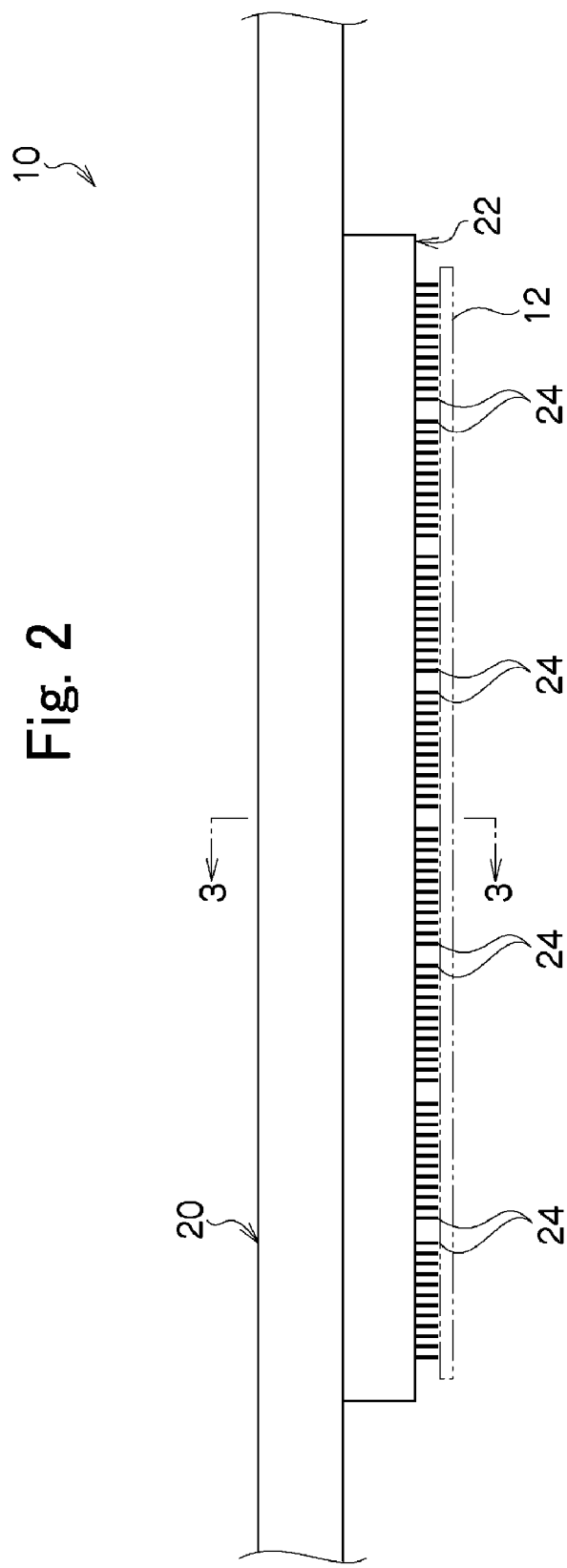
FIG. 2 is a front view of the electrical connecting apparatus shown in FIG. 1.
Figure 3:
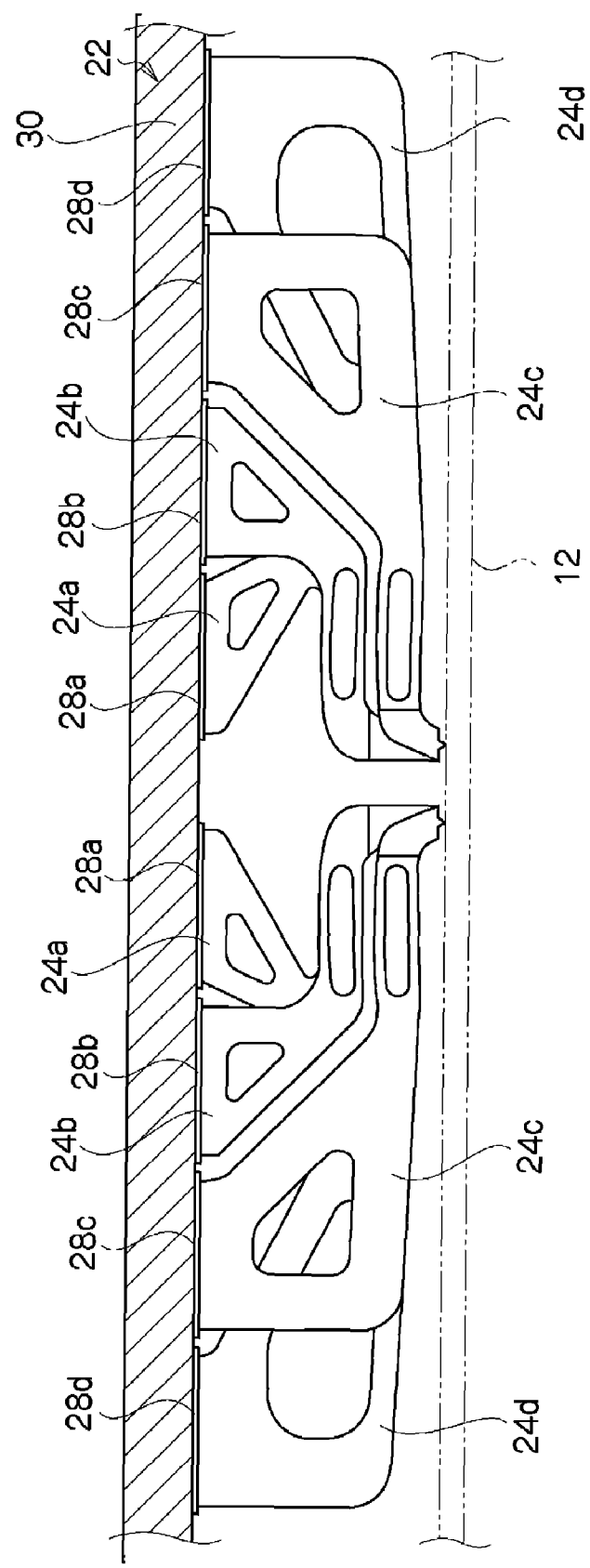
FIG. 3 is an enlarged cross-sectional view obtained along the 3-3 line in FIG. 2.

In the present invention, in FIG. 3, the left-right direction is referred to as a left-right direction or an X direction (extending direction of contactors), the direction perpendicular to the drawing sheet is referred to as a front-back direction or a Y direction (arrangement direction of the contactors in each contactor group), the up-down direction is referred to as an up-down direction or a Z direction, and the plane including the X direction and the Y direction is referred to as a horizontal plane. However, these directions and plane differ depending on the posture in which a device under test is arranged in a testing apparatus.

Accordingly, as for the above directions and plane, the plane including the X direction and the Y direction may be determined to be within any one plane of a horizontal plane vertical to the vertical line, an inclined plane inclined to the horizontal plane, and a vertical plane vertical to the horizontal plane or may be determined to be a combination of these planes in accordance with an actual testing apparatus.

Also, in the present invention, the probe tip side of the contactor is referred to as a tip end side or a front side, and the opposite side is referred to as a back end side or a back side.

Embodiment

Referring to FIGS. 1 to 10, an electrical connecting apparatus 10 is adapted to test, as a flat-plate-shaped device under test 12, a semiconductor wafer having multiple non-cutting integrated circuit regions (regions under test) in a matrix form and is constituted so as to enable an electrical test of the multiple integrated circuit regions or regions under test simultaneously at a time or in several batches.

Each region under test has a plurality of pad electrodes 14 (refer to FIG. 7) in two lines spaced from each other in the left-right direction, that is, in the form of two electrode arrays. The plurality of pad electrodes 14 in the electrode array located on one side in the left-right direction constitute a first electrode group, and the plurality of pad electrodes 14 in the electrode array located on the other side in the left-right direction constitute a second electrode group.

The electrodes 14 in each electrode group are aligned in a line, being spaced from one another in the front-back direction. The positions in the left-right direction of the electrodes 14 in the respective electrode groups of the regions under test adjacent to one another in the front-back direction are corresponded to one another.

The electrical connecting apparatus 10 includes a circular wiring board 20, a rectangular probe board 22 arranged on the lower surface of the wiring board 20, and a plurality of contactors 24 arranged on the lower surface of the probe board 22.

The wiring board 20 has at the edge portion on the upper surface of the wiring board 20 a plurality of tester lands 26 to be connected to electrical circuits of a tester and has on the lower surface and inside a plurality of wires electrically connected to the tester lands 26 in one-to-one relationship although not shown in figures.

The probe board 22 has a plurality of mounting portions 28 each having conductivity on the lower surface of an electrical insulating plate 30 and has a plurality of internal wires (not shown) electrically connected to the mounting portions 28 in one-to-one relationship in the electrical insulating plate 30.

Although, in the example shown in the figures, the mounting portion 28 is an independent probe land electrically connected to the internal wire of the probe board 22, it may be a part of the internal wire exposed on the lower surface of the probe board 22.

Each wire of the probe board 22 is electrically connected to the aforementioned not shown wire of the wiring board 20. Thus, each mounting portion 28 is electrically connected to the wire of the wiring board 20 in one-to-one relationship. The multiple contactors 24 and the multiple mounting portions 28 are respectively allocated per regions under test that are to be tested simultaneously. The contactors 24 and the mounting portions 28 correspond to one another and to the electrodes 14 in one-to-one relationship.

The wiring board 20 and the probe board 22 are relatively positioned by a plurality of positioning pins (not shown) extending through them in the thickness direction and are mutually coupled by a plurality of screw members (not shown).

The multiple mounting portions 28 allocated to the regions under test are divided into first, second, third, and fourth mounting portion groups each including plural mounting portions 28 spaced from one another in the front-back direction and located on one side (left side in FIGS. 3 and 4 in the example shown in the figures) in the left-right direction in relation to a first virtual line VL1 extending in the front-back direction located at the center of the electrodes 14 in the left-right direction and fifth, sixth, seventh, and eighth mounting portion groups each including plural mounting portions 28 spaced from one another in the front-back direction and located on the other side (right side in FIGS. 3 and 4 in the example shown in the figures) in the left-right direction in relation to the first virtual line VL1.

In the example shown in the figures, the mounting portions in the first, second, third, and fourth mounting portion groups are shown by adding alphabets a, b, c, and d to their numerals 28, and the mounting portions in the fifth, sixth, seventh, and eighth mounting portion groups are shown by adding alphabets a, b, c, and d to their numerals 28.

Figure 4:
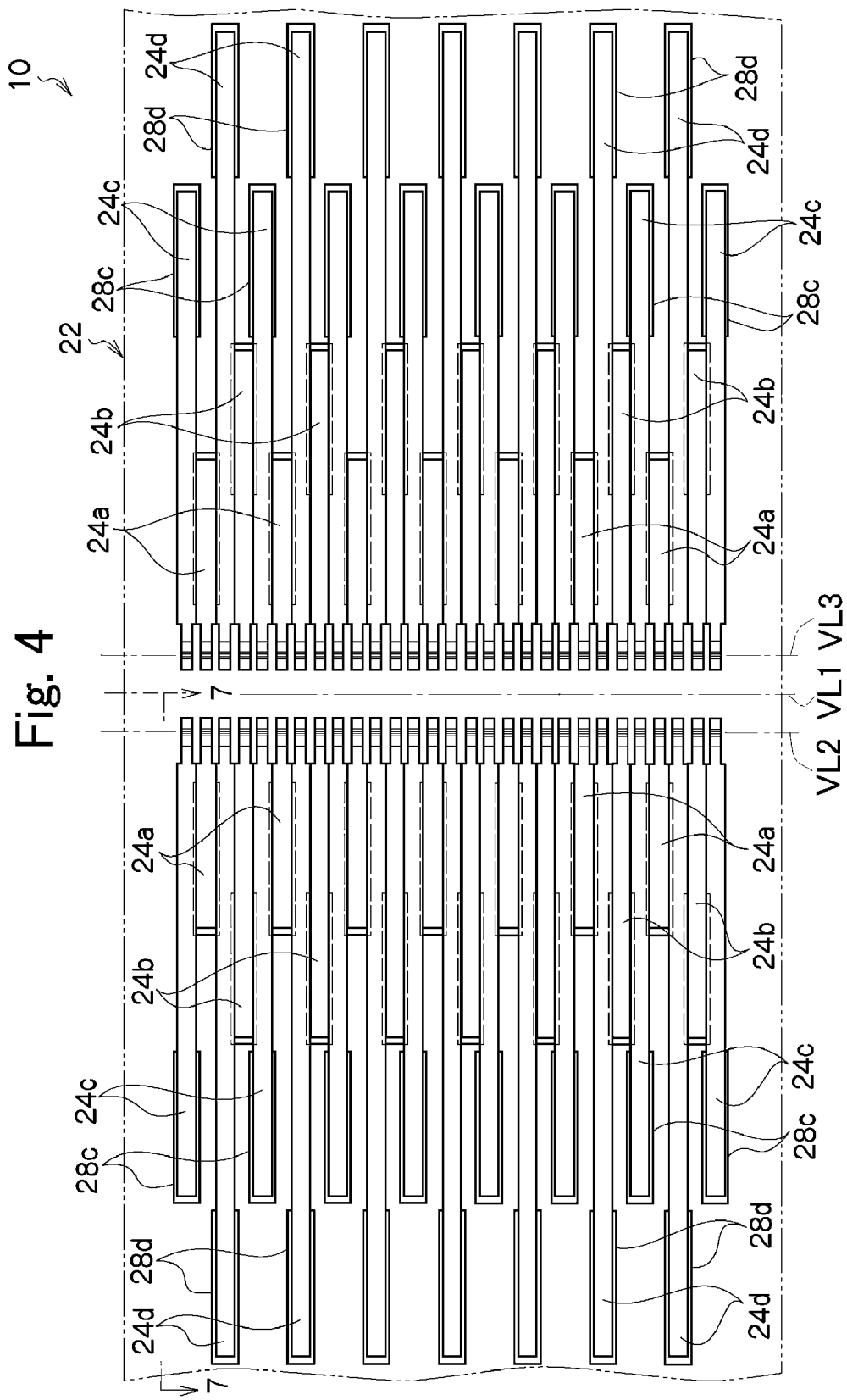
FIG. 4 is a partially enlarged bottom view of the electrical connecting apparatus shown in FIG. 1.
Figure 5:
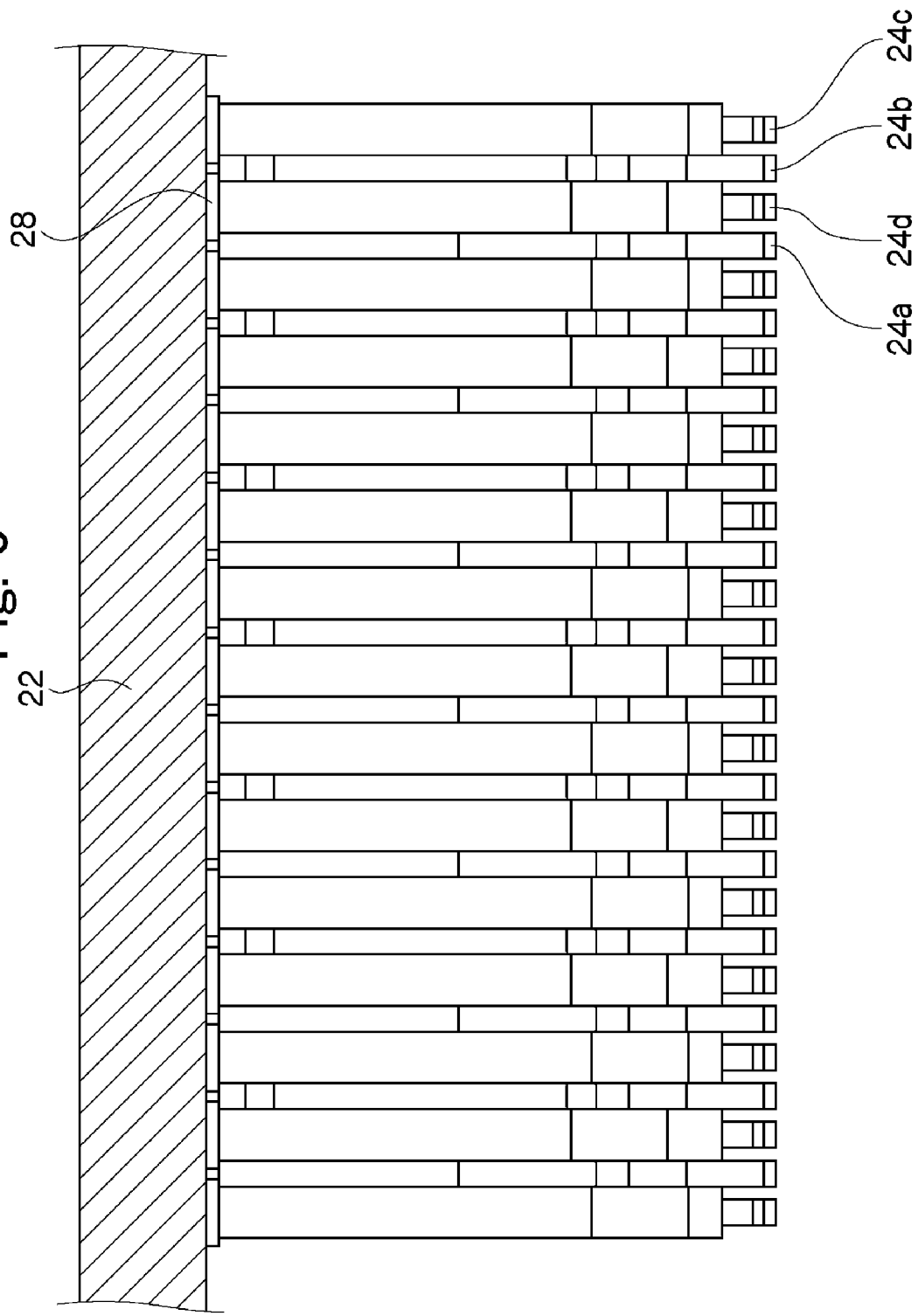
FIG. 5 is a view obtained along the 5-5 line in FIG. 4.
Figure 6:
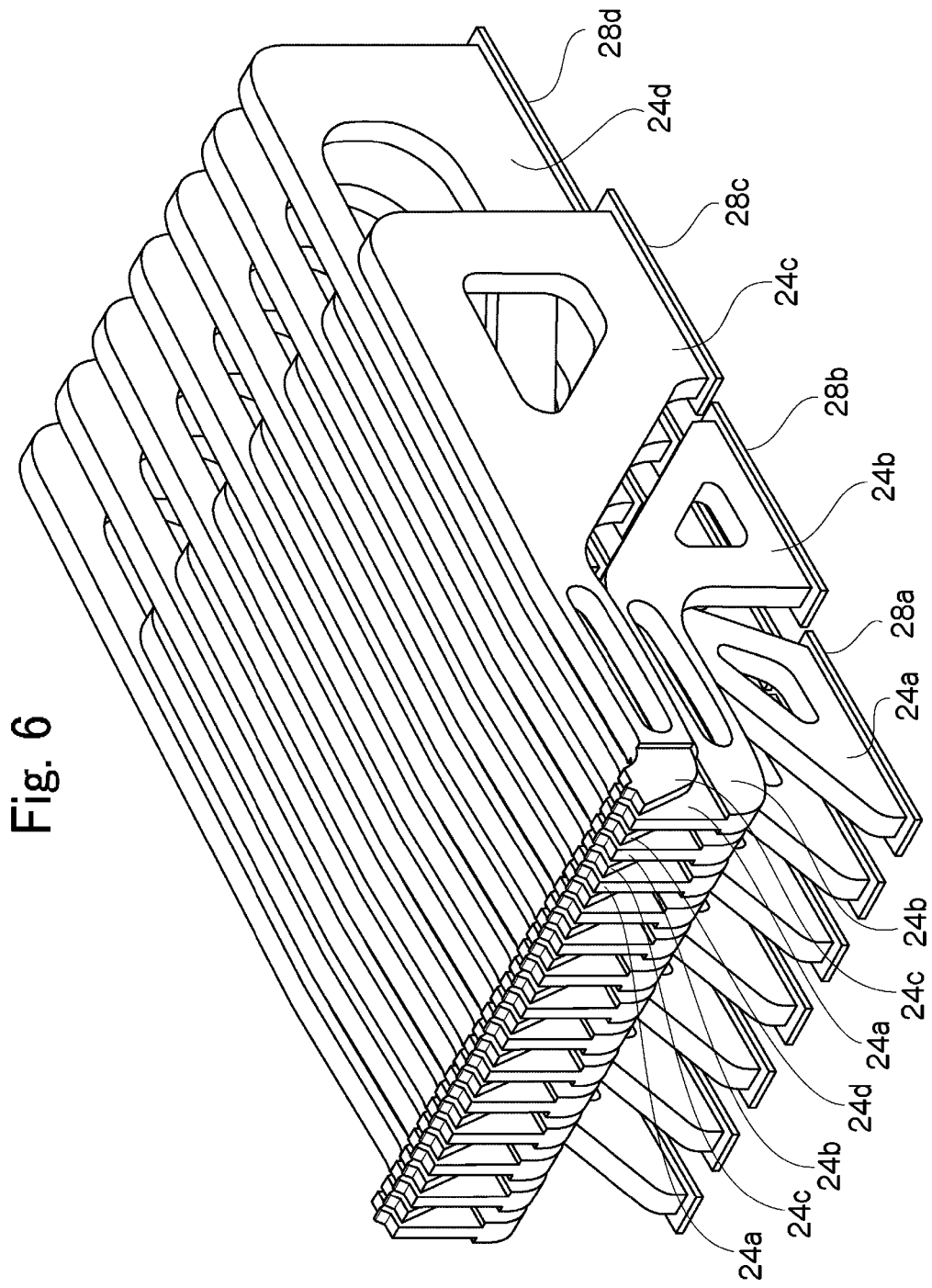
FIG. 6 is a partially enlarged perspective view showing inversely upside-down direction of the electrical connecting apparatus shown in FIG. 1.
Figure 7:
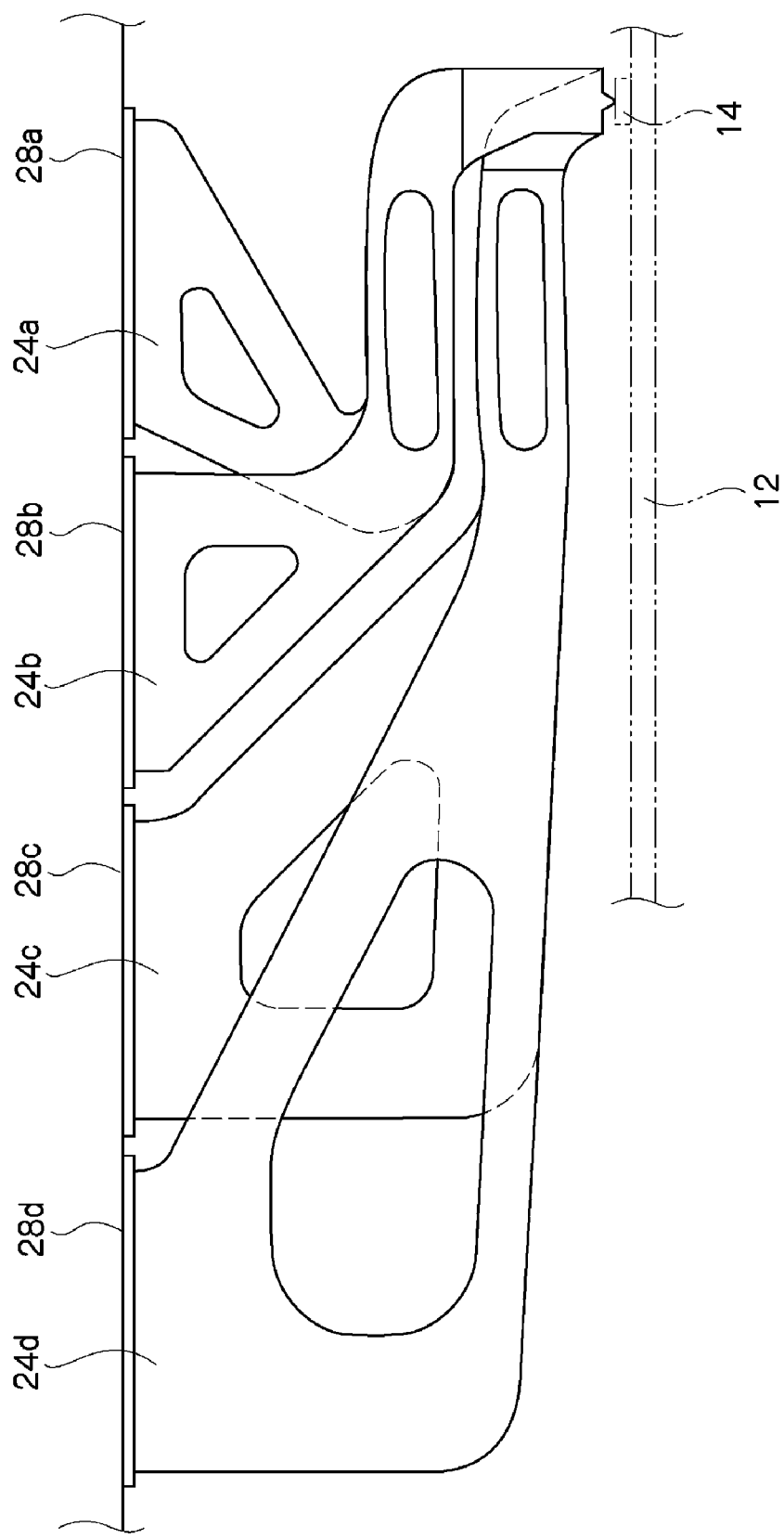
FIG. 7 is an enlarged cross-sectional view obtained along the 7-7 line in FIG. 4.
Figure 8:
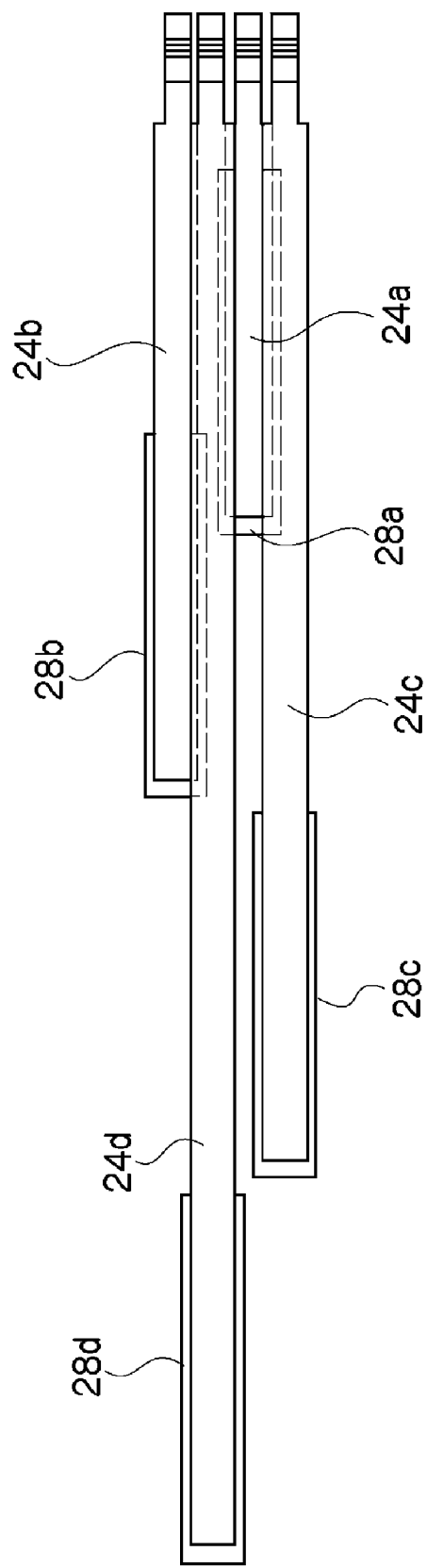
FIG. 8 shows relationship between electrodes of a device under test and mounting portions of a probe board in the electrical connecting apparatus shown in FIG. 1.
Figure 9:
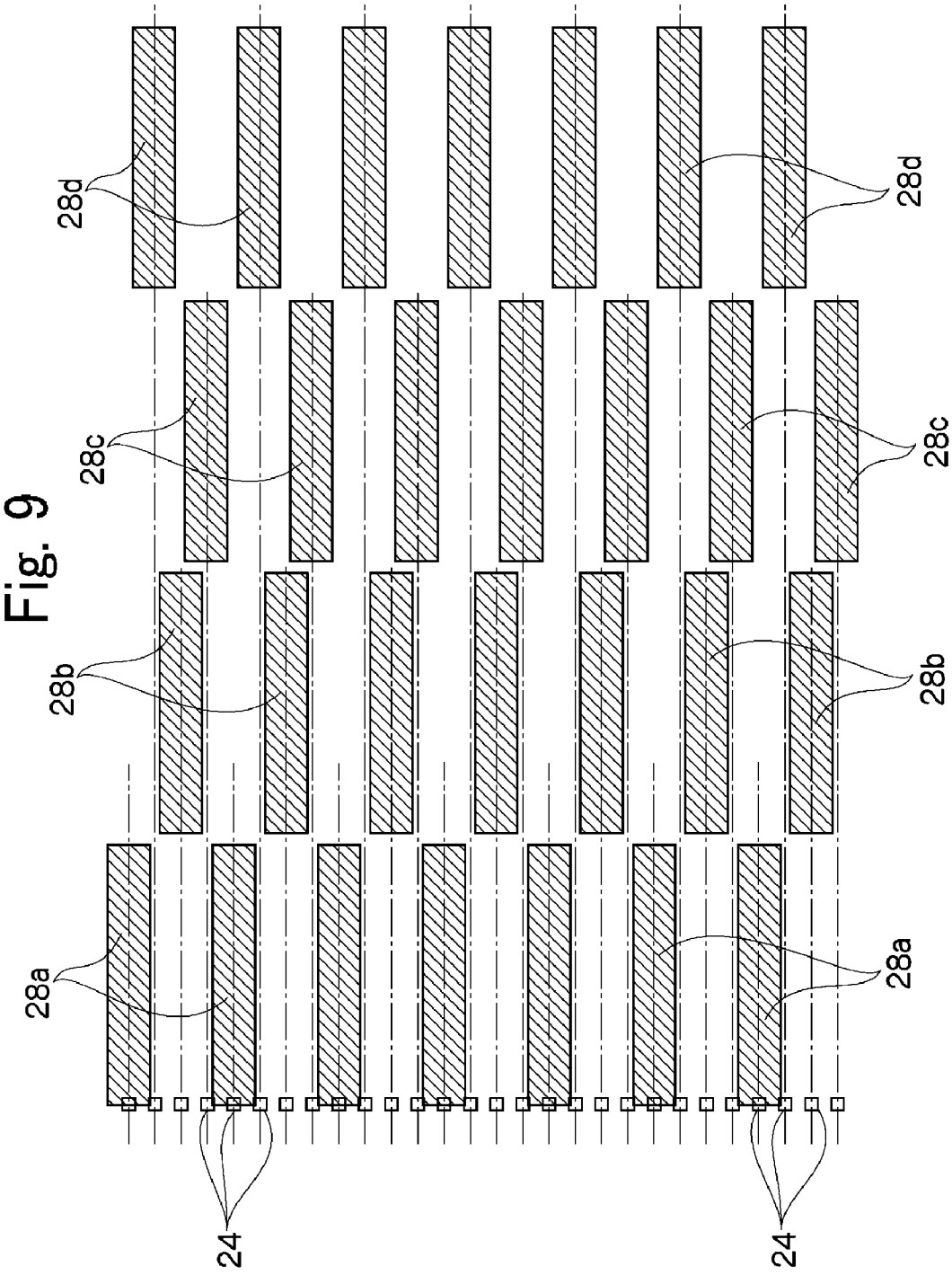
FIG. 9 is an arrangement view showing an arrangement example of the mounting portions.

As shown in FIGS. 3, 4, and 9, the mounting portions 28a, 28b, 28c, and 28d in the first, second, third, and fourth mounting portion groups are formed on the board 22 such that they are mutually distanced in the left-right direction, and such that their positions in the left-right direction are distanced from the first virtual line VL1 further in the order of the mounting portions in the first, second, third, and fourth mounting portion groups.

In the same manner as above, the mounting portions 28a, 28b, 28c, and 28d in the fifth, sixth, seventh, and eighth mounting portion groups are also formed on the board 22 so that they are mutually distanced in the left-right direction, and so that their positions in the left-right direction are distanced from the first virtual line VL1 further in the order of the mounting portions in the fifth, sixth, seventh, and eighth mounting portion groups.

Each of the mounting portions 28a, 28b, 28c, and 28d in each mounting portion group of the first, second, third, and fourth mounting portion groups is displaced, for each group, in the front-back direction from the mounting portions in the other mounting portion groups and is placed such that these mounting portions are repeatedly arranged in the front-back direction in the order of the mounting portions 28a, 28d, 28b, 28c, 28a . . . .

In the same manner as above, each of the mounting portions 28a, 28b, 28c, and 28d in the fifth, sixth, seventh, and eighth mounting portion groups is also displaced for each group, in the front-back direction from the mounting portions in the other mounting portion groups and is placed such that these mounting portions are repeatedly arranged in the front-back direction in the order of the mounting portions 28a, 28d, 28b, 28c, 28a . . . .

As shown in FIG. 10, each contactor 24 is a plate-shaped blade-type probe comprising a plate-shaped seat portion 32 mounted on the corresponding mounting portion 28 at the upper end portion, a plate-shaped arm portion 34 extending in the left-right direction from the lower end of the seat portion 32, and a plate-shaped probe tip portion 36 extending downward from the tip end portion of the arm portion 34. The probe tip portion 36 has a probe tip 38 at its lower end.

The seat portion 32 and the arm portion 34 have holes passing through them in the thickness direction. The hole of the arm portion 34 is an elongated hole elongated in the left-right direction. Accordingly, the arm portion 34 is elastically deformed easily when overdrive acts on the contactor 24.

Each contactor 24 is mounted to the corresponding mounting portion 28 of the probe board 22 in a cantilevered manner at the seat portion 32 with its thickness direction being the front-back direction and in a state where the probe tip 38 accords with a second or third virtual line VL2 or VL3 corresponding to the positions of the electrodes 14 of one or the other of the aforementioned electrode arrays.

The multiple contactors 24 allocated to each of the regions under test are divided into first, second, third, and fourth contactor groups each including plural contactors 24 displaced from one another in the front-back direction and located on one side in the left-right direction in relation to the first virtual line VL1 and fifth, sixth, seventh, and eighth contactor groups each including plural contactors 24 displaced from one another in the front-back direction and located on the other side in the left-right direction in relation to the first virtual line VL1.

In the example shown in the figures, the contactors in the first, second, third, and fourth contactor groups are shown by adding alphabets a, b, c, and d to their numerals 24, and the contactors in the fifth, sixth, seventh, and eighth contactor groups are shown by adding alphabets a, b, c, and d to their numerals 24.

As shown in FIGS. 3 to 7, the contactors 24a, 24b, 24c, and 24d in the first, second, third, and fourth contactor groups are attached to the probe board 22 such that they are mutually distanced in the left-right direction, and such that their mounting positions to the probe board 22 in the left-right direction are distanced from the second virtual line VL2 further in the order of the contactors in the first, second, third, and fourth contactor groups.

In the same manner as above, the contactors 24a, 24b, 24c, 24d in the fifth, sixth, seventh, and eighth contactor groups are also attached to the probe board 22 such that they are mutually distanced in the left-right direction, and such that their mounting positions to the probe board 22 in the left-right direction are distanced from the third virtual line VL3 further in the order of the contactors in the fifth, sixth, seventh, and eighth contactor groups.

Each of the contactors 24a, 24b, 24c, and 24d in the first, second, third, and fourth contactor groups is displaced in the front-back direction from the contactors in the other contactor groups and is placed such that these contactors are repeatedly arranged in the front-back direction in the order of the contactors 24a, 24d, 24b, 24c, 24a . . . .

In the same manner as above, each of the contactors 24a, 24b, 24c, and 24d in the fifth, sixth, seventh, and eighth contactor groups is also displaced in the front-back direction from the contactors in the other contactor groups and is placed such that these contactors are repeatedly arranged in the front-back direction in the order of the contactors 24a, 24d, 24b, 24c, 24a . . . .

Since the distance dimension from the electrode group to each mounting portion 28 differs depending on the mounting portion group, the respective locations of the contactors 24a, 24b, 24c, and 24d differ from one another. This will be explained below with reference to FIG. 10.

The height positions of the probe tips of the contactors 24a, 24b, 24c, and 24d in the respective contactor groups from the corresponding mounting portions 28a, 28d, 28b, 28c (height dimensions of the contactors 24 from the corresponding mounting portions 28 to the probe tips 38) are identical.

The dimensions of the arm portions 34 in the up-down direction (width dimensions), the dimensions of the seat portions 32 and the arm portions 34 in the front-back direction (thickness dimensions), and the dimensions of the arm portions 34 in the left-right direction (length dimensions) are also identical to one another, respectively.

The height dimensions from the mounting portions 28 of the seat portions 32 of the contactors 24a, 24b in the first, second, fifth, and sixth contactor groups (height dimensions of the contactors 24 from the corresponding mounting portions 28 to the probe tips 38) are identical.

The height dimensions from the mounting portions 28 of the seat portions 32 of the contactors 24c, 24d in the third, fourth, seventh, and eighth contactor groups are mutually identical, but are greater than the height dimensions from the mounting portions 28 of the seat portions 32 of the contactors 24a, 24b in the first, second, fifth, and sixth contactor groups as much as the added amount of several micrometers to several tens of micrometers or so to the width dimensions of the arm portions 34.

From the foregoing explanation, the height dimensions from the mounting portions 28 of the arm portions 34 of the contactors 24c, 24d in the third, fourth, seventh, and eighth contactor groups are greater than the height dimensions from the mounting portions 28 of the arm portions 34 of the contactors 24a, 24b in the first, second, fifth, and sixth contactor groups.

The dimensions in the front-back direction of the probe tip portions 36 and the probe tips 38 of the contactors 24a, 24, 24c, and 24d in the respective contactor groups (thickness dimensions) are mutually identical, but are smaller than the thickness dimensions of the seat portions 32 and the arm portions 34.

The dimensions in the up-down direction of the probe tip portions 36 of the contactors 24a, 24b in the first, second, fifth, and sixth contactor groups (length dimensions) are identical. However, the dimensions in the up-down direction of the probe tip portions 36 of the contactors 24c, 24d in the third, fourth, seventh, and eighth contactor groups (length dimensions) are mutually identical, but are smaller than those of the probe tip portions 36 of the contactors 24a, 24b in the first, second, fifth, and sixth contactor groups as much as the difference between the height dimensions of the seat portions 32.

The length dimensions in the left-right direction of the seat portions 32 of the contactors 24a, 24b, 24c, 24d in the first to eighth contactor groups (dimensions from the back ends of the mounting parts of the seat portions 32 to the corresponding mounting portions 28 to the arm portions 34) gradually increase in the order of the contactors 24a, 24b, 24c, 24d.

The seat portions 32 of the contactors 24a in the first and fifth contactor groups have inclined surfaces 40a directing obliquely downward on a side opposite the electrode group side. The seat portions 32 of the contactors 24b in the second and sixth contactor groups have inclined surfaces 40b directing obliquely downward on the opposite side to the electrode group side.

The seat portions 32 of the contactors 24c in the third and seventh contactor groups have inclined surfaces 40c directing obliquely upward on the electrode group side. The seat portions 32 of the contactors 24d in the fourth and eighth contactor groups have inclined surfaces 40d directing obliquely upward on the electrode group side.

Each contactor 24 is attached to a predetermined mounting portion 28 with use of a heat source such as laser and conductive adhesive such as solder.

The probe board 22 having the above contactors 24 can be assembled in the following procedures.

Figure 11:
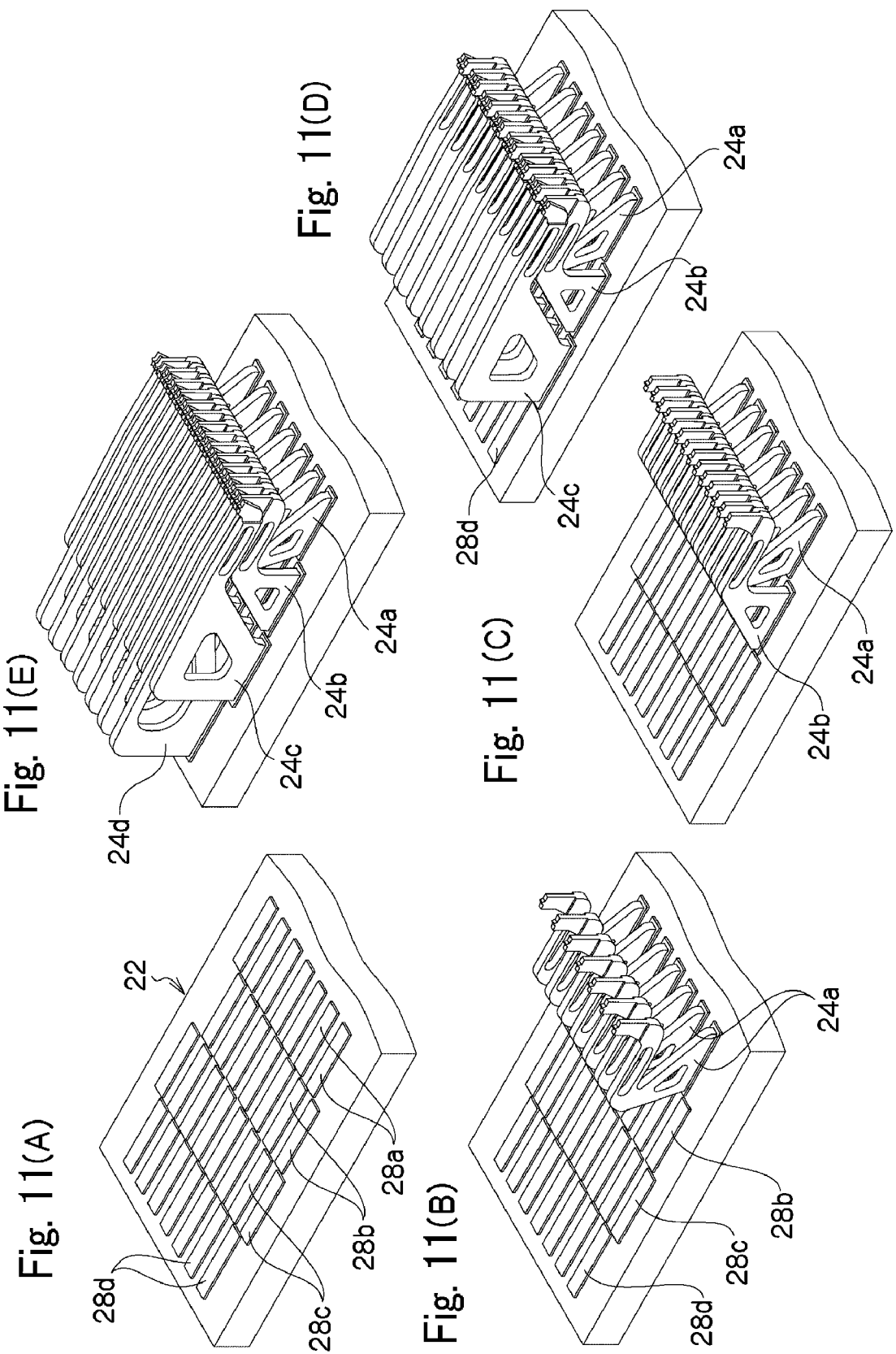
FIG. 11 explains a method for assembling a probe board in the electrical connecting apparatus shown in FIG. 1.

First, as shown in FIG. 11(A), the probe board 22 having the multiple mounting portions is prepared. In parallel with this, the aforementioned multiple contactors 24a, 24b, 24c, and 24d are prepared.

Next, as shown in FIG. 11(B), the contactors 24a in the first contactor group are attached to the predetermined mounting portions 28a. Next, as shown in FIG. 11(C), the contactors 24b in the second contactor group are attached to the predetermined mounting portions 28b. Next, as shown in FIG. 11(D), the contactors 24c in the third contactor group are attached to the predetermined mounting portions 28c. Next, as shown in FIG. 11(E), the contactors 24d in the fourth contactor group are attached to the predetermined mounting portions 28d.

As a result of the above operations, as shown in FIG. 11(E), the probe board 22 having the respective contactors 24 in the first, second, third, and fourth contactor groups is assembled.

The contactors 24 in the fifth, sixth, seventh, and eighth contactor groups are attached to the predetermined mounting portions in the same manner as above.

The electrical connecting apparatus 10 is attached to the tester in a state where the wiring board 20 is on the upper side, and where the contactors 24 are on the lower side. In a state of being attached to the tester, the electrical connecting apparatus 10 is thrust to the pad electrodes 14 of the device under test 12 at the probe tips 38 of the respective contactors 24.

By doing so, overdrive acts on each contactor 24, and each contactor 24 is elastically deformed at the arm portion 34. In this state, power is supplied from the tester to a predetermined contactor 24 via the tester land 26, the wire of the wiring board 20, and the wire of the probe board 22, and an electrical signal is outputted from the predetermined contactor 24 to the tester.

In the electrical connecting apparatus 10, the center-to-center dimension in the left-right direction of the mounting positions to the board 22 of the contactors 24 adjacent to one another in the front-back direction and the center-to-center dimension in the front-back direction of the mounting positions of the contactors 24 adjacent to one another in the front-back direction respectively increase.

As a result of the above, even when the arrangement pitch of the contactors 24 is reduced, it is prevented that heat at the time of mounting of the contactors 24 influences the adjacent mounting portions 28, which prevents the adjacent mounting portions 28 from being damaged. Also, since the seat portions 34 and the arm portions 36 of the adjacent contactors 24 are not opposed to each other, electrical interference between the adjacent contactors 24 is prevented or reduced.

Also, since the contactors 24 in the first, second, third, and fourth contactor groups and the contactors 24 in the fifth, sixth, seventh, and eighth contactor groups are arranged to be symmetrical centering on the first virtual line VL1, the electrical connecting apparatus 10 can be applied to an electrical test of a device under test having more electrodes 14 on each region under test.

In the above embodiments, the contactors 24a, 24b, 24c, and 24d in the first, second, third, and fourth contactor groups and the contactors 24a, 24b, 24c, and 24d in the fifth, sixth, seventh, and eighth contactor groups are placed such that these contactors are repeatedly arranged in the front-back direction in the order of the contactors 24a, 24d, 24b, 24c, 24a . . . .

Figure 12:
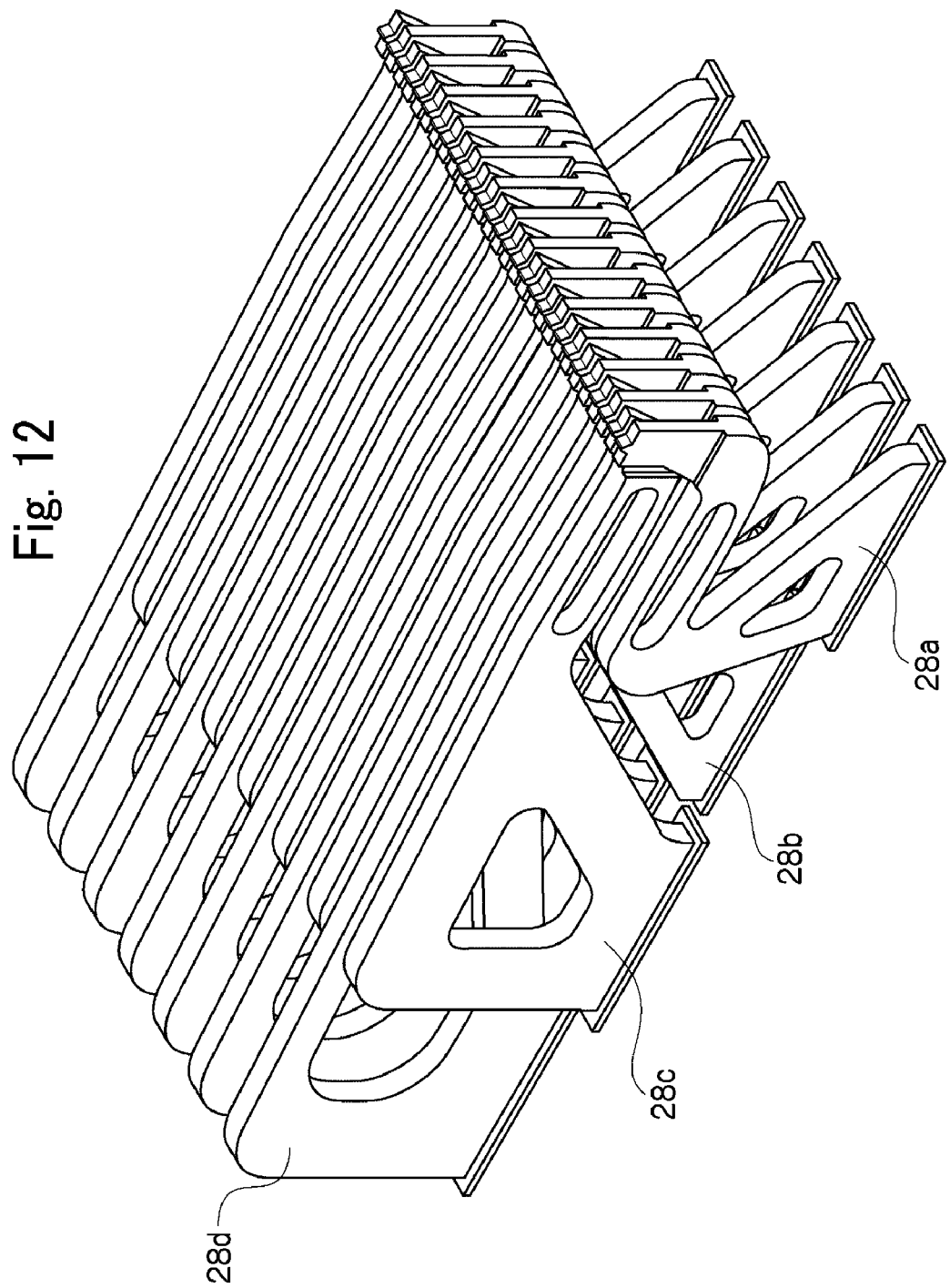
FIG. 12 is an enlarged upside-down perspective view of another arrangement example of the contactors.

However, as shown in FIG. 12, the contactors 24a, 24b, 24c, and 24d in the first, second, third, and fourth contactor groups and the contactors 24a, 24b, 24c, and 24d in the fifth, sixth, seventh, and eighth contactor groups may be placed such that these contactors are repeatedly arranged in the front-back direction in the order of the contactors 24a, 24c, 24b, 24d, 24a . . . .

In the above case, the probe board 22 in which the mounting portions 28a, 28b, 28c, and 28d are arranged as shown in FIG. 13 is used.

The present invention do not need to comprise either the contactors 24a, 24b, 24c, and 24d in the first, second, third, and fourth contactor groups or the contactors 24a, 24b, 24c, and 24d in the fifth, sixth, seventh, and eighth contactor groups.

Also, the present invention can be applied not only to an electrical connecting apparatus for a device under test having a plurality of electrodes in two arrays on the region under test but also to an electrical connecting apparatus for a device under test having a plurality of electrodes in one array or three or more arrays on the region under test.

Further, the present invention can be applied to an electrical connecting apparatus in which contactors are attached directly to a wiring board.

The present invention is not limited to the above embodiments but may be altered in various ways without departing from the spirit and scope of the present invention.

What is claimed is:

1. An electrical connecting apparatus comprising:
  a board having first, second, third, and fourth mounting portion groups each including a plurality of mounting portions spaced from one another in a front-back direction and arranged on a lower surface of said board such that said mounting portions in each of said mounting portion group are displaced in a left-right direction from said mounting portions in the other of said mounting portion groups; and
  first, second, third, and fourth contactor groups each including a plurality of plate-shaped contactors in which said contactors in said first, second, third, and fourth contactor groups respectively correspond to said mounting portions in said first, second, third, and fourth mounting portion groups and are mounted to corresponding mounting portions in a cantilevered manner in a state of extending from said corresponding mounting portions in the same direction, and in which the mounting positions to said board are displaced in said left-right direction,
  wherein each said contactor has a seat portion mounted on said corresponding mounting portion at the upper end portion, an arm portion extending in said left-right direction from the lower end of said seat portion, and a probe tip portion extending downward from the tip end portion of said arm portion and having a probe tip at the lower end,
  wherein said contactors in said first, second, third, and fourth contactor groups are identical in terms of the height positions of said probe tips but are different from one another in terms of the shapes of said seat portions, and
  wherein the height positions of said arm portions of said contactors in said first contactor group are different from the height positions of said arm portions of said contactors in at least said third and fourth contactor groups.

2. The electrical connecting apparatus according to claim 1, wherein said probe tips of said contactors in said first, second, third, and fourth contactor groups are aligned on a common virtual line extending in said front-back direction.

3. The electrical connecting apparatus according to claim 1, wherein the height positions of said arm portions of said contactors in said first and second contactor groups are identical, and the height positions of said arm portions of said contactors in said third and fourth contactor groups are identical.

4. The electrical connecting apparatus according to claim 3, wherein said seat portions of said contactors in said first, second, third, and fourth contactor groups are mounted to said mounting portions in a state where the mounting positions to said board are gradually distanced in said left-right direction from the positions of said probe tips further in the order of said first, second, third, and fourth contactor groups.

5. The electrical connecting apparatus according to claim 3, wherein each of said seat portions of each of said contactors in said first, second, third, and fourth contactor groups has an inclined portion inclined on one side or the other side in said left-right direction to said board.

6. The electrical connecting apparatus according to claim 5, wherein each said seat portion of each said contactor in said first contactor group is inclined on one side in said left-right direction, and said inclined portion of each said seat portion of each said contactor in said second, third, and fourth contactor groups is inclined on the other side in said left-right direction.

7. The electrical connecting apparatus according to claim 3, wherein said contactors in said first, second, third, and fourth contactor groups are placed alternately in said front-back direction in the order of said contactors in said first, third, second, and fourth contactor groups or in the order of said contactors in said first, fourth, second, and third contactor groups.

8. The electrical connecting apparatus according to claim 7, wherein said contactors adjacent to one another in said front-back direction overlap one another at parts of said arm portions, seen from the upper side.

9. The electrical connecting apparatus according to claim 1, wherein said board further has fifth, sixth, seventh, and eighth mounting portion groups each including a plurality of mounting portions at positions distanced from said mounting portions in said first, second, third, and fourth mounting portion groups at the same side in the left-right direction further than the positions of said probe tips of said respective contactors in said first, second, third, and fourth contactor groups and arranged on said lower surface such that said mounting portions in each of said fifth, sixth, seventh, and eighth mounting portion groups are displaced in said front-back direction from one another, for each group, and that said mounting portions in said fifth, sixth, seventh, and eighth mounting portion groups are placed alternately in said front-back direction, said electrical connecting apparatus further comprising:
fifth, sixth, seventh, and eighth contactor groups each including a plurality of plate-shaped contactors in which said contactors in said fifth, sixth, seventh, and eighth contactor groups respectively correspond to said mounting portions in said fifth, sixth, seventh, and eighth mounting portion groups and are mounted on corresponding mounting portions in a cantilevered manner in a state of extending from said corresponding mounting portions to a side of said contactors in said first, second, third, and fourth contactor groups, and in which the mounting positions to said board are displaced in said left-right direction, wherein each of said contactors in said fifth, sixth, seventh, and eighth contactor groups has a seat portion mounted on said corresponding mounting portion at the upper end portion, an arm portion extending in said left-right direction from the lower end of said seat portion, and a probe tip portion extending downward from the tip end portion of said arm portion and having a probe tip at the lower end, wherein said contactors in said fifth, sixth, seventh, and eighth contactor groups are identical in terms of the height positions of said probe tips but are different from one another in terms of the shapes of said seat portions, and wherein the height positions of said arm portions of said contactors in said fifth contactor group are different from the height positions of said arm portions of said contactors in at least said seventh and eighth contactor groups.

10. The electrical connecting apparatus according to claim 9, wherein said probe tips of said contactors in said first, second, third, and fourth contactor groups are aligned on a common virtual line, and wherein said probe tips of said contactors in said fifth, sixth, seventh, and eighth contactor groups are aligned on another common virtual line extending in said front-back direction distanced opposite a side of said contactors in said first, second, third, and fourth contactor groups from said virtual line on which said probe tips of said contactors in said first, second, third, and fourth contactor groups are aligned.

* * * * *